US007125587B2

(12) United States Patent
Viviani

(10) Patent No.: US 7,125,587 B2
(45) Date of Patent: Oct. 24, 2006

(54) ION BEAM FOR ENHANCING OPTICAL PROPERTIES OF MATERIALS

(75) Inventor: Gary L. Viviani, Boxford, MA (US)

(73) Assignee: Varian Semiconductor Equipment Associates Inc., Gloucester, MA (US)

( * ) Notice: Subject to any disclaimer, the term of this patent is extended or adjusted under 35 U.S.C. 154(b) by 0 days.

(21) Appl. No.: 10/151,271

(22) Filed: May 20, 2002

(65) Prior Publication Data

US 2003/0215579 A1 Nov. 20, 2003

(51) Int. Cl.
B05D 5/06 (2006.01)
B05D 3/06 (2006.01)
C23C 14/02 (2006.01)
C23C 14/04 (2006.01)
C23C 14/48 (2006.01)
C23C 16/02 (2006.01)

(52) U.S. Cl. .................. 427/525; 427/526; 427/533; 427/534; 427/162; 118/718; 118/728; 118/733

(58) Field of Classification Search ................ 427/525, 427/523, 524, 533, 534, 551, 562; 216/66, 216/87, 94
See application file for complete search history.

(56) References Cited

U.S. PATENT DOCUMENTS

| 4,622,918 | A | * | 11/1986 | Bok ............................. 118/718 |
| 4,655,168 | A | * | 4/1987 | Shimozato et al. .......... 118/718 |
| 4,681,780 | A | * | 7/1987 | Kamman ..................... 118/721 |
| 4,692,233 | A | * | 9/1987 | Casey .......................... 118/718 |
| 4,885,070 | A | * | 12/1989 | Campbell et al. ....... 204/142.11 |
| 5,116,461 | A | * | 5/1992 | Lebby et al. ................... 216/2 |
| 5,203,924 | A | * | 4/1993 | Mitani et al. ................ 427/533 |
| 5,389,195 | A | * | 2/1995 | Ouderkirk et al. ............ 216/66 |
| 5,770,826 | A | * | 6/1998 | Chaudhari et al. ...... 204/157.15 |
| 6,458,285 | B1 | * | 10/2002 | Iyama et al. ................... 216/66 |
| 6,475,571 | B1 | * | 11/2002 | Echigo et al. ............... 427/533 |
| 6,602,559 | B1 | * | 8/2003 | Honda et al. ................ 427/533 |
| 6,724,963 | B1 | * | 4/2004 | Neuberger ................... 385/123 |
| 2002/0063055 | A1 | * | 5/2002 | Katoh et al. ............ 204/192.32 |
| 2002/0076161 | A1 | * | 6/2002 | Hirabayashi et al. .......... 385/40 |
| 2003/0210371 | A1 | * | 11/2003 | Chaudhari et al. ........... 349/124 |

FOREIGN PATENT DOCUMENTS

| JP | 8-313912 | * | 11/1996 |
| JP | 10-54988 | * | 2/1998 |
| JP | 2005-189788 | * | 7/2005 |
| WO | WO 92/06486 | * | 4/1982 |

* cited by examiner

Primary Examiner—Marianne Padgett

(57) ABSTRACT

A system and method to expose a material to an ion beam during a continuous material production process may include a vacuum fixture to form the ion beam and a slit in the fixture to allow at least a portion of the ion beam to exit the fixture through the slit. The material can be placed in contact with an exterior area of the fixture so as to cover the slit. With the material in place, the vacuum within the fixture may be maintained and the ion beam formed. The material over the slit can be exposed to the ion beam. As the continuous process moves material past the slit, the vacuum within the vacuum fixture may help to maintain the material in contact with the fixture.

14 Claims, 4 Drawing Sheets

ION BEAM FOR ENHANCING OPTICAL PROPERTIES OF MATERIALS

RELATED APPLICATIONS

There are no related applications.

FIELD

The systems and methods relate to ion beam alignment of molecules, and more particularly to applying a wide ion beam to a continuous thin film production process.

BACKGROUND

The alignment of liquid crystals, such as required for operation of a Liquid Crystal Display (LCD), can be influenced by the walls of the container holding the liquid crystals. Currently available LCDs may have thin polymer films that cover the side of the glass substrate in contact with the liquid crystal, which influence the orientation of the liquid crystals. The direction of the polymer chains in these films can be defined by rubbing the surface with a velvet-like cloth.

This process introduces debris, making it more difficult to maintain the clean room environment required for making the LCDs. Rubbing can also leave streaks and produce electrostatic charge, which degrade image quality. A contact-free, or minimal contact process would provide a higher quality product and may significantly reduce costs associated with maintaining the clean room environment.

It has been found that liquid crystals can be aligned on polymer films or amorphous solids when the surface is exposed to an ion beam. The ion beam exposure alters the optical properties of the polymer film or amorphous solid so as to facilitate the alignment of the liquid crystals. A large variety of industrial applications, such as fiber optics manufacturing and thin film processing, may also benefit from the altered or enhanced optical properties of such polymer films and amorphous solids.

The polymer films that may be used in these applications normally can be produced in a continuous production process. It would be advantageous to provide an ion beam exposure system and method, which can align the polymeric chains of such films during production of the polymer film.

In the production of typical LCDs, i.e., those on substrates about 1 m² or less, the substrates can be mounted on a moving stage within an ion beam fixture and linearly scanned beneath the ion source in a batch processing mode. For larger substrates, it may be impractical to place the substrate within the ion beam fixture. Thus, there is a further need to provide a system and method for ion beam exposure for larger substrates.

SUMMARY

According to the methods and systems described herein, one embodiment of a method for exposing a material to an ion beam may include providing a vacuum fixture to form the ion beam, providing a slit in the fixture to allow at least a portion of the ion beam to exit the fixture through the slit and placing the material in contact with an exterior area of the fixture to cover the slit to maintain the vacuum within the fixture and further to expose the material to the portion of the ion beam exiting the fixture.

Enhancements of the method may comprise moving the material across the slit to expose different portions of the material to the ion beam exiting the fixture; providing a low friction material on the exterior area of the surface that the material contacts; and applying a force on the material to hold the material in contact with the exterior area. Further enhancements may comprise incorporating the method into a continuous thin film polymer production process; and forming the exterior area surrounding the slit in a concave shape and using a weight of the material to hold the material in contact with the exterior area, or forming the exterior area surrounding the slit in a convex shape and using a tension force on the material to hold the material in contact with the exterior area.

In one embodiment of a system, an ion beam forming vacuum chamber has a slit to allow the ion beam to exit the chamber and material brought in contact with the outer surfaces of the chamber surrounding the slit to maintain the vacuum within the chamber and to be exposed to the ion beam.

Enhancements of the system may comprise a low friction material fixed to the exterior area of the surface that the material contacts; incorporating the system into a continuous thin film polymer production system; and rollers to tension the thin film polymer so as to hold the material in contact with the outer surface of the chamber.

BRIEF DESCRIPTION OF THE DRAWINGS

The following figures depict certain illustrative embodiments of the systems and methods in which like reference numerals refer to like elements. These depicted embodiments are to be understood as illustrative and not as limiting in any way.

DETAILED DESCRIPTION OF THE PREFERRED EMBODIMENT

Figure 1:
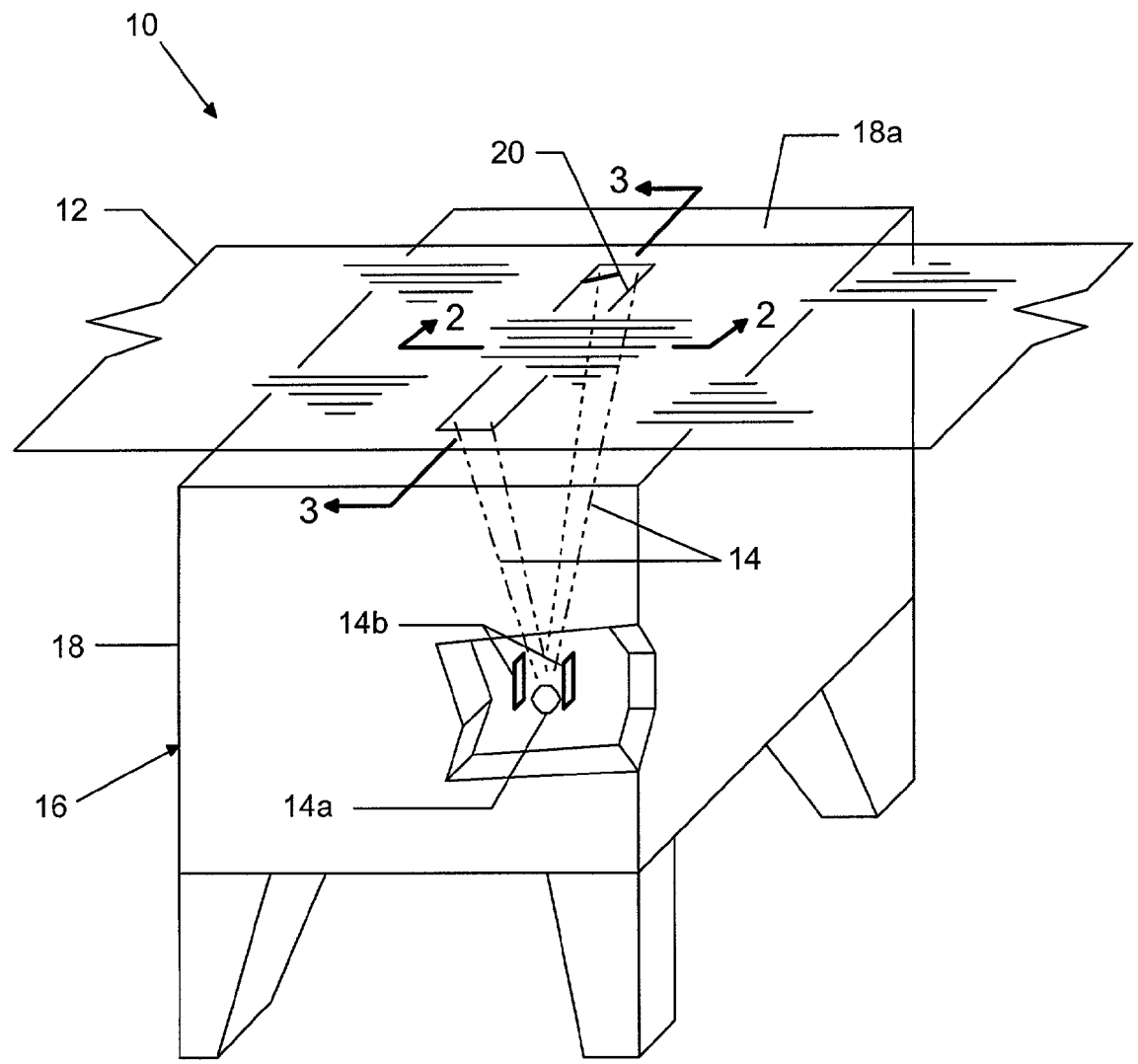
FIG. 1 shows a schematic representation of a system that exposes a thin film material to an ion beam.

Referring to FIG. 1, there is shown a schematic representation of a system 10 to expose a material 12 to an ion beam 14. Ion beam 14 can be formed by fixture 16. Ion beam forming fixtures are well-known and may take a wide variety of forms, such as those manufactured by Varian Semiconductor Equipment Associates, Inc, of Gloucester, Mass., and may provide ion beams of various widths and heights. It will be understood that fixtures may be chosen to provide a range of beam areas (width×height) and beam areas further may be adjusted within the parameters of the chosen fixture. Preferably, fixture 16 can be a wide ion beam-forming fixture adapted for operation with system 10. Fixtures providing beams on the order of 12×3 inches are known and means and methods for providing greater widths are known to those of skill in the art. A vacuum can be maintained in the vacuum chamber 18 of fixture 16 in order to form ion beam 14.

In order to expose material 12 to ion beam 14, slit 20 can be formed in chamber 18, through which ion beam 14 can exit chamber 18. To maintain the vacuum within chamber 18, material 12 can be brought in contact with outer surface 18a of chamber 18, surrounding slit 20.

Figure 2:
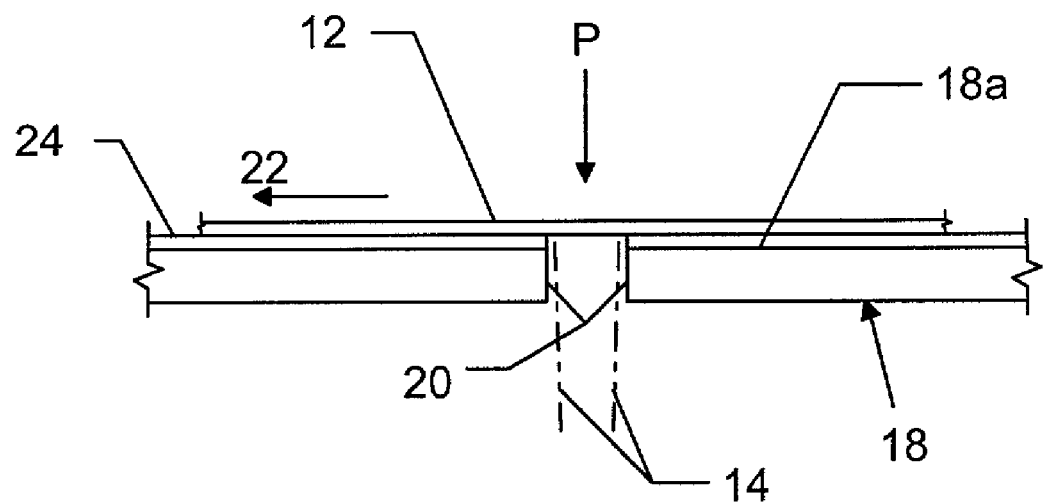
FIG. 2 shows a cross sectional view of the system of FIG. 1, illustrating the exposure of the material to the ion beam.
Figure 3:
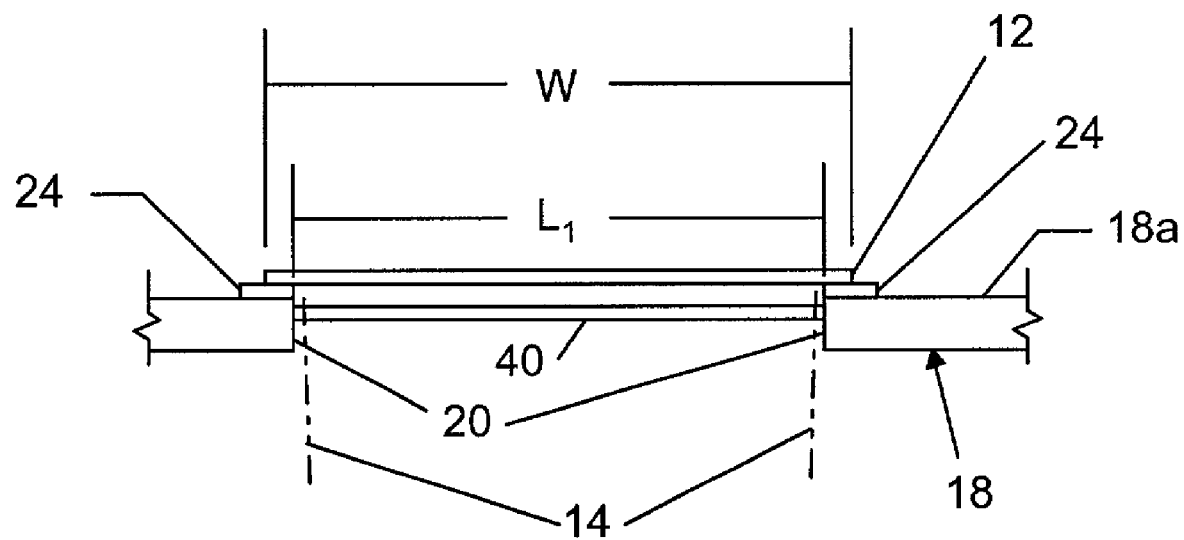
FIG. 3 shows a longitudinal cross sectional view corresponding to FIG. 2.

Referring now to FIGS. 2 and 3, cross-sectional illustrations of chamber 18 are shown, taken along lines 2—2 and 3—3 of FIG. 1, respectively. When material 12 contacts surface 18a and covers slit 20, a vacuum applied within chamber 18 creates a differential pressure force, P, which tends to hold material 12 against surface 18a. In the longitudinal cross-section along slit 20 shown in FIG. 3, a width, W, of material 12 can be greater than a length, $L_1$, of slit 20. Preferably, material 12 can be generally centered over slit 20 and the difference ($W-L_1$) can be minimized so as to expose the maximum amount of material 12 to ion beam 14.

In a preferred embodiment, material 12 may be a thin film polymer, such as polyethylene or polypropylene, and the system 10 may be incorporated into a continuous production process for material 12. In this embodiment, a continuous length of material 12 can be moved past slit 20 in a direction of arrow 22, shown in FIG. 2. A non-stick, or low-friction coating 24 can be applied to surface 18a in contact with material 12 to facilitate movement of material 12 over surface 18a. Preferably, coating 24 may be chosen in conjunction with material 12 to minimize debris, streaking and electrostatic charge build-up.

Figure 4A:
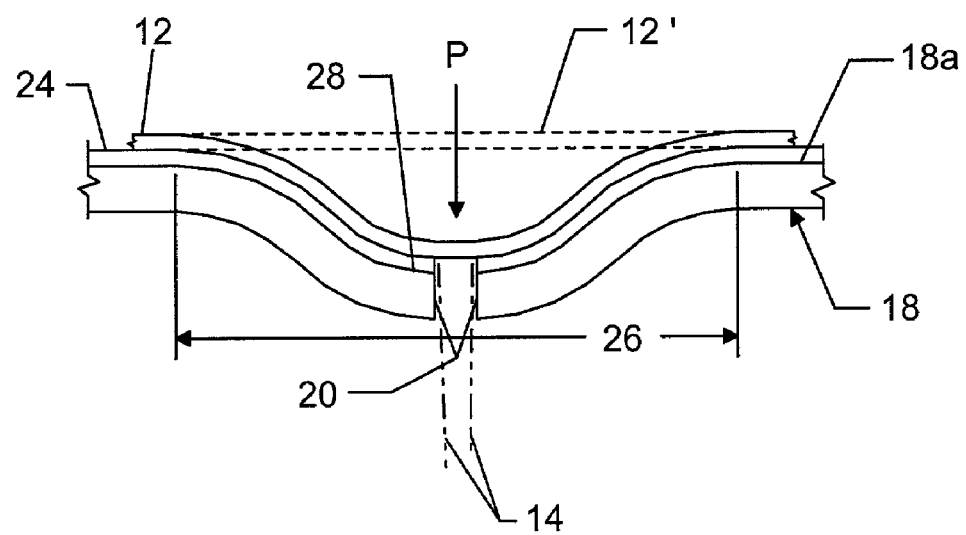
FIGS. 4a and 4b show cross sectional views, corresponding to FIGS. 2 and 3, respectively, of an embodiment of the system of FIG. 1 illustrating a configuration for exposing the material to the ion beam.
Figure 4B:
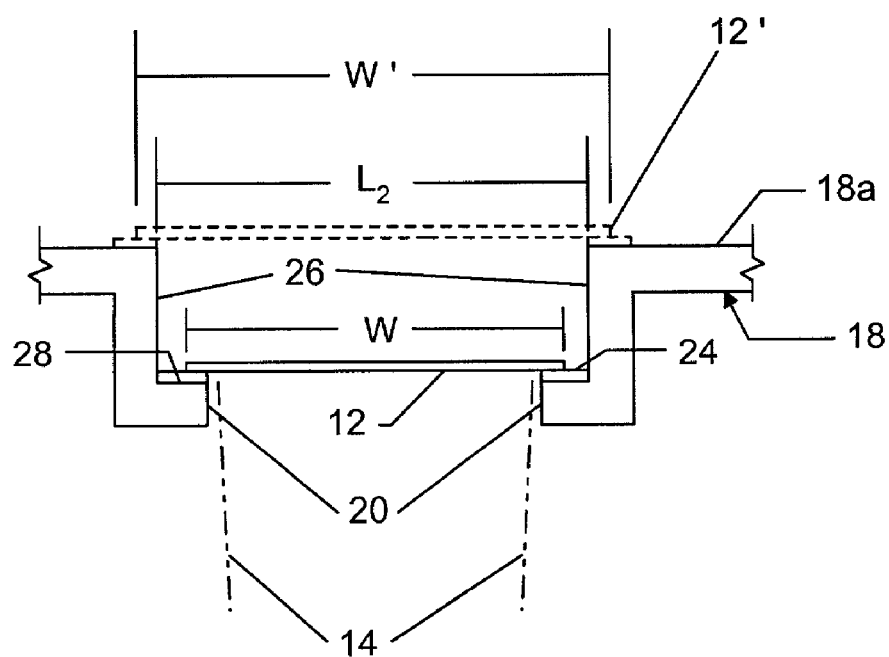

FIGS. 4a and 4b are cross-sectional views corresponding to FIGS. 2 and 3, respectively, and illustrating an embodiment of the system 10 wherein slit 20 can be formed within depression 26 in surface 18a. In FIG. 4a, depression 26 is illustrated with a preferably curved profile. It will be understood that other profiles may be provided, including forming depression 26 with flat surfaces. When flat surfaces are used, care will be taken to prevent abrasion of material 12 over any sharp edges of depression 26.

Preferably, slit 20 can be formed in a bottom surface 28 of depression 26, though other locations for slit 20 within depression 26 may be equally satisfactory. As seen in FIG. 4b, a length $L_2$ of depression 26 is preferably greater than width W of material 12. A weight of material 12 initially may cause material 12 to drape within depression 26. As material 12 is moved past slit 20, force P can maintain material 12 in contact with surface 18a.

It is known that thin film polymers in some continuous production processes may be tensioned. In such production processes, material 12 may not drape within depression 26. In such cases, system 10 can be configured such that width W' of material 12' (shown as dotted in FIGS. 4a and 4b) is greater than length $L_2$ of depression 26.

Figure 5A:
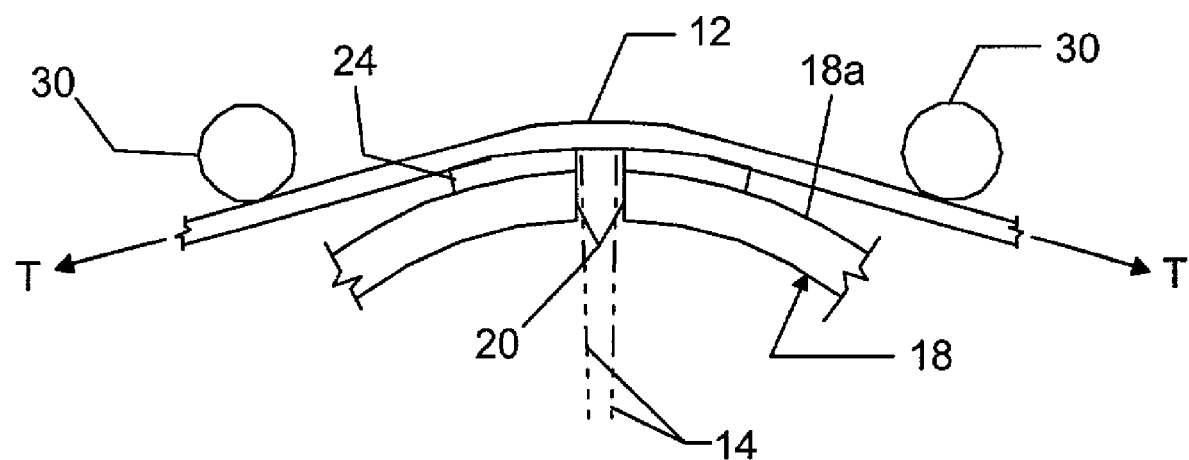
FIGS. 5a and 5b show cross sectional views, corresponding to FIGS. 2 and 3, respectively, of one embodiment of the system of FIG. 1 illustrating another configuration for exposing the material to the ion beam.
Figure 5B:
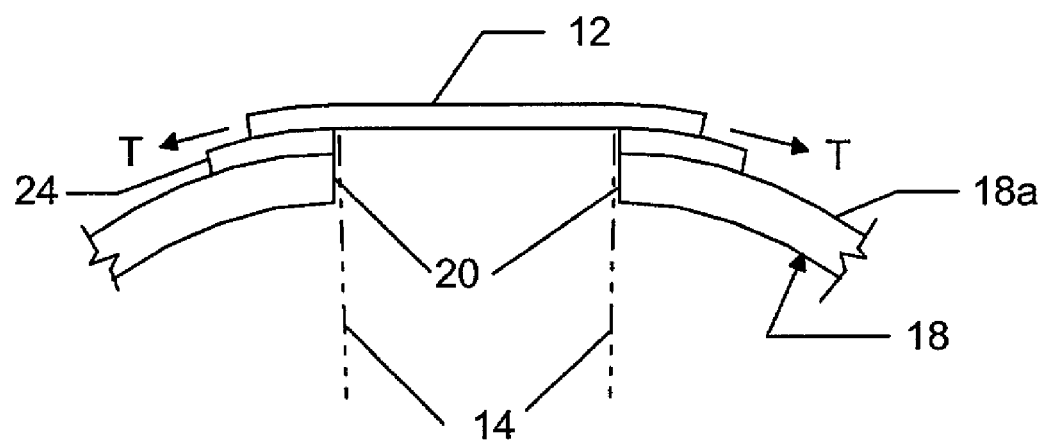

FIGS. 5a and 5b are cross-sectional views corresponding to FIGS. 2 and 3, respectively, and illustrating a preferred embodiment of the system 10 when material 12 is tensioned. In the embodiment of FIGS. 5a and 5b, surface 18a can be convex in a region around slit 20. In this configuration, a tension force T may be applied to material 12 resulting from the continuous production process, or may be applied to material 12 specifically to make contact with surface 18a. Rollers 30 (FIG. 5a) may be attached to fixture 16 so as to provide force T.

Preferably surface 18a may be convex in a direction corresponding to line 2—2 of FIG. 1, i.e., generally corresponding to the direction of movement shown by arrow 22 of FIG. 2, or transverse to a longitudinal length of slit 20. As shown in FIGS. 5a and 5b, however, surface 18a may be convex in both transverse and longitudinal directions of the slit 20 and, further, may be convex in solely the longitudinal direction of FIG. 5b. Additionally, force T may be applied intermittently, e.g., material 12 may be gripped, the force T applied and the material 12 may then be released.

Enhancements of the disclosed system may be provided by varying the angle at which the beam strikes the material by changing the location of the ion beam source 14a (shown in FIG. 1) within vacuum chamber 18. The incident angle of the ion beam also may be controlled by using electrode plates 14b, as is well known in the art. Further enhancements may include varying the size or energy level of the ion beam.

While the systems and methods have been disclosed in connection with the preferred embodiments shown and described in detail, various modifications and improvements thereon will become readily apparent to those skilled in the art. As an example, long chain polymers other than polyethylene and polypropylene may be used. Further, exposure of materials such as diamond-like carbon or amorphous silicon to an ion beam may cause a rearrangement of atoms at their surfaces that may also be used to align liquid crystals.

It can be seen that varying degrees of stiffness of the materials used may be easily accommodated in the embodiments described herein. Additionally, movement of the material over the slit may be accomplished in a variety of directions and the material may be rotated to provide alignment of the liquid crystals in multiple directions. The systems and methods described herein also may find use in batch processing of selected shapes and sizes of material in lieu of use in a continuous production process. Further, masks, as are known in the art of ion implantation, may be incorporated into the slit to provide alignment patterns within the material, such as mask 40 illustrated in FIG. 3. Accordingly, the spirit and scope of the present systems and methods are to be limited only by the following claims.

What is claimed is:

1. A method for exposing a continuous length of a polymer film or an amorphous solid to an ion beam from a vacuum fixture, comprising:
   (a) providing a slit in the vacuum fixture allowing at least a portion of the ion beam to exit the vacuum fixture through the slit; and
   (b) placing a predetermined length of the polymer film or amorphous solid in contact with an exterior area of the vacuum fixture to cover the slit to maintain a vacuum within the vacuum fixture and to expose the predetermined length of the polymer film or amorphous solid to the at least portion of the ion beam exiting the vacuum fixture for altering optical properties on the predetermined length of the polymer film or amorphous solid to facilitate alignment of liquid crystals by the polymer film or amorphous solid.

2. The method of claim 1, wherein placing the predetermined length of the polymer film or amorphous solid further comprises applying a force on the continuous length of the polymer film or amorphous solid to hold the predetermined length of the polymer film or amorphous solid in contact with the exterior area while being exposed to the ion beam.

3. The method of claim 2, wherein applying the force comprises using a weight of the continuous length of the polymer film or amorphous solid and a pressure differential between the vacuum within the vacuum fixture and a pressure exterior to the vacuum fixture.

4. The method of claim 2, wherein applying the force comprises:
   (a) forming the exterior area into a convex shape; and
   (b) tensioning the continuous length of the polymer film or amorphous solid over the convex shape.

5. The method of claim 1, further comprising moving the continuous length of the polymer film or amorphous solid across the slit to expose different portions of the predetermined length of the polymer film or amorphous solid to the at least portion of the ion beam exiting the vacuum fixture.

6. The method of claim 5, wherein providing the slit comprises providing a coating on the exterior area for minimizing friction between contacting portions of the continuous length of the polymer film or amorphous solid and the exterior area.

7. The method of claim 5, wherein moving the continuous length of the polymer film or amorphous solid is incorporated into a continuous production process for the predetermined length of the polymer film or amorphous solid.

8. The method of claim 5, wherein the continuous length is the polymer film, which is a thin film polymer.

9. The method of claim 8, wherein moving the continuous length of the thin film polymer is incorporated into a continuous production process for the predetermined length of the thin film polymer.

10. The method of claim 9, wherein providing the slit comprises providing a coating on the exterior area for minimizing friction between contacting portions of the continuous length of the thin film polymer and the exterior area.

11. The method of claim 10, wherein placing the predetermined length of the thin film polymer comprises applying a force on the continuous length of the thin film polymer to hold the predetermined length of the thin film polymer in contact with the exterior area while being exposed to the ion beam.

12. The method of claim 11, wherein applying the force comprises using a weight of the continuous length of the thin film polymer and a pressure differential between the vacuum within the vacuum fixture and a pressure exterior to the vacuum fixture.

13. The method of claim 11, wherein applying the force comprises:

(a) forming the exterior area into a convex shape; and (b) tensioning the continuous length of the thin film polymer over the convex shape.

14. The method of claim 1, comprising masking the slit to expose the predetermined length of the polymer film or amorphous solid to the at least portion of the ion beam in a pattern corresponding to the masking.

* * * * *